US012787450B2

(12) United States Patent
Fan et al.

(10) Patent No.: US 12,787,450 B2
(45) Date of Patent: Nov. 3, 2026

(54) VT1 REDUCTION USING VERTICAL NPN

(71) Applicant: Taiwan Semiconductor Manufacturing Company, Ltd., Hsinchu (TW)

(72) Inventors: Ken-Hao Fan, Hsinchu (TW); Yu-Ti Su, Hsinchu (TW); Sheng-Fu Hsu, Hsinchu (TW); Hao-Hua Hsu, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 516 days.

(21) Appl. No.: 18/347,254

(22) Filed: Jul. 5, 2023

(65) Prior Publication Data

US 2025/0015073 A1 Jan. 9, 2025

(51) Int. Cl.
*H10D 89/60* (2025.01)

(52) U.S. Cl.
CPC ......... *H10D 89/713* (2025.01); *H10D 89/811* (2025.01)

(58) Field of Classification Search
CPC ... H10D 89/713; H10D 89/811; H10D 89/813
See application file for complete search history.

(56) References Cited

U.S. PATENT DOCUMENTS

| | | | | |
|---|---|---|---|---|
| 6,255,713 | B1 * | 7/2001 | Chi | H10D 84/406 257/548 |
| 6,399,990 | B1 * | 6/2002 | Brennan | H10D 89/811 257/370 |
| 6,501,632 | B1 * | 12/2002 | Avery | H02H 9/046 361/111 |
| 6,674,622 | B1 | 1/2004 | Yu et al. | |
| 6,756,642 | B2 * | 6/2004 | Lee | H10D 89/713 257/355 |
| 7,394,133 | B1 | 7/2008 | Vashchenko et al. | |
| 2005/0082619 | A1 * | 4/2005 | Wu | H10D 89/811 257/361 |
| 2009/0050970 | A1 * | 2/2009 | Schneider | H10D 62/133 438/237 |
| 2015/0137246 | A1 * | 5/2015 | Shapiro | H10D 1/47 257/350 |
| 2019/0043854 | A1 | 2/2019 | Appaswamy et al. | |
| 2021/0366897 | A1 | 11/2021 | Choi et al. | |

FOREIGN PATENT DOCUMENTS

| | | | |
|---|---|---|---|
| CN | 102292813 | A | 12/2011 |
| TW | 200503233 | A | 1/2005 |
| TW | 200601543 | A | 1/2006 |
| TW | 202010136 | A | 3/2020 |
| TW | 202111911 | A | 3/2021 |
| WO | 2010/074939 | A1 | 7/2010 |

* cited by examiner

*Primary Examiner* — Yasser A Abdelaziez
(74) *Attorney, Agent, or Firm* — Merchant & Gould P.C.

(57) ABSTRACT

A semiconductor device that includes an n-buried layer, a p-well region over the n-buried layer, an n-channel MOSFET that includes an n-drain region, and a vertical NPN BJT having a collector that is the n-drain region and a base that is the p-well region. The p-well region is floating.

20 Claims, 9 Drawing Sheets

VT1 REDUCTION USING VERTICAL NPN

BACKGROUND

Semiconductor devices are becoming faster and smaller. In one aspect, semiconductor manufacturers improve the performance and reduce the size of the semiconductor devices by shrinking process geometries. Often, semiconductor devices with smaller process geometries are more susceptible to degradation and damage due to electro-static discharge (ESD). To protect the devices against ESD degradation and damage, ESD protection devices are added to the semiconductor devices. Typically, an ESD implant is included for ESD protection in a metal-oxide semiconductor field-effect transistor (MOSFET) semiconductor device, such as a resistive protective oxide (RPO) MOSFET device. However, one or more extra masks are used to manufacture the ESD implant, which increases the cost of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
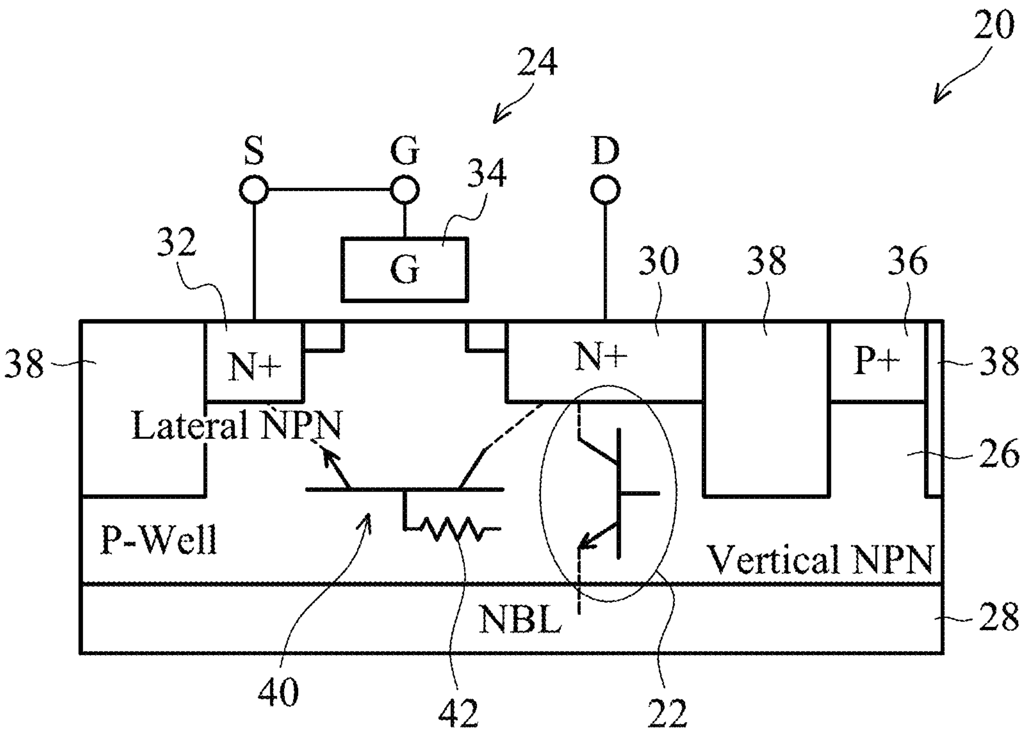
FIG. 1 is a diagram schematically illustrating a cross-section of a semiconductor device that includes a parasitic vertical NPN BJT for discharging ESD current, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments provide a semiconductor device that includes a parasitic vertical NPN bipolar junction transistor (BJT) for discharging ESD current. Advantages of the parasitic vertical NPN BJT for ESD protection include a lower ESD triggering voltage Vt1. In some embodiments, the semiconductor device is an RPO MOS device.

The semiconductor device includes an n-buried layer, a p-well region over the n-buried layer, and a snapback device for ESD protection. The snapback device includes an n-channel MOSFET that includes an n-drain region and an n-source region. The parasitic vertical NPN BJT includes a collector at the n-drain region, an emitter at the n-buried layer, and a base at the p-well region, where the p-well region is floating and not connected to a reference voltage or a power voltage. With the floating p-well, the parasitic vertical NPN BJT has a lower ESD triggering voltage Vt1. In some embodiments, the n-drain region is an n+-drain region and, in some embodiments, the n-source region is an n+-source region.

FIG. 1 is a diagram schematically illustrating a cross-section of a semiconductor device 20 that includes a parasitic vertical NPN BJT 22 for discharging ESD current, in accordance with some embodiments. The semiconductor device 20 is a snapback device for discharging ESD current. The semiconductor device 20 includes a MOSFET 24 over a p-well region 26 that is over an n-buried layer 28. In some embodiments, the MOSFET 24 is an RPO MOSFET.

The MOSFET 24 includes an n-drain region 30, an n-source region 32, and a gate 34. The p-well region 26 includes a p+ contact 36 and the MOSFET 24 further includes isolation regions 38 on each side of the MOSFET 24 and adjacent the p+ contact 36. In some embodiments, the n-drain region 30 is an n+-drain region and, in some embodiments, the n-source region 32 is an n+-source region.

The n-drain region 30 is the collector of the parasitic vertical NPN BJT 22 and the n-buried layer 28 is the emitter of the parasitic vertical NPN BJT 22. The p-well region 26 is the base of the parasitic vertical NPN BJT 22. In some embodiments, the n-drain region 30 is electrically connected to an input/output (I/O) pad. Also, in some embodiments, the n-source region 32 is electrically connected to the gate 34.

In operation, the n-buried layer 28 is electrically connected to a reference voltage, such as ground, and the p-well region 26 is floating with the p+ contact 36 not connected to a reference voltage or a power voltage. When an ESD event hits the n-drain region 30, which may be electrically connected to an I/O pad, the parasitic vertical NPN BJT 22 is biased on, such as due to avalanche breakdown through the collector to the base and the emitter. With the base floating, the ESD trigger voltage Vt1 for biasing on the parasitic vertical NPN BJT 22 is lower, such that the parasitic vertical NPN BJT 22 is biased on sooner. The lower ESD trigger voltage Vt1 biases on the parasitic vertical NPN BJT 22, which provides an early ESD discharge path through the parasitic vertical NPN BJT 22 to the n-buried layer 28.

The parasitic vertical NPN BJT 22 is biased on at a lower ESD trigger voltage Vt1 in comparison to an ESD trigger voltage Vt1 for biasing on a parasitic lateral NPN BJT 40 in a different configuration of the semiconductor device 20. In this different configuration, the parasitic lateral NPN BJT 40 includes the n-drain region 30 as a collector, the n-source region 32 as an emitter, and the p-well region 26 as a base. However, to use the parasitic lateral NPN BJT 40 for discharging ESD current, each of the p+ contact 36 and the n-source region 32 is electrically connected to a reference voltage, such as ground. This provides a base resistance 42 between the base of the parasitic lateral NPN BJT 40 and the p+ contact 36. When an ESD event hits the n-drain region 30, the parasitic lateral NPN BJT 40 is biased on, such as due to avalanche breakdown through the collector and the base to the p+ contact 36. The base current through the base resistance 42 establishes a base voltage at the base that biases on the parasitic lateral NPN BJT 40 to discharge ESD current through the parasitic lateral NPN BJT 40 to the n-source region 32. The ESD trigger voltage Vt1 for biasing on the parasitic lateral NPN BJT 40 is higher than the ESD trigger voltage Vt1 for biasing on the parasitic vertical NPN BJT 22.

Figure 2:
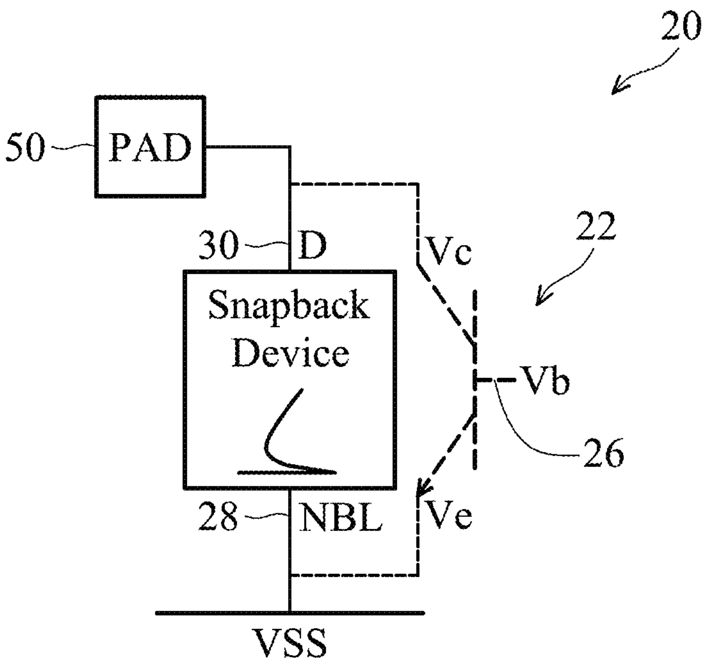
FIG. 2 is a diagram schematically illustrating the semiconductor device of FIG. 1 as a snapback device, in accordance with some embodiments.

FIG. 2 is a diagram schematically illustrating the semiconductor device 20 as a snapback device, in accordance with some embodiments. The semiconductor device 20 is electrically connected to an I/O pad 50 and to a reference voltage Vss. In some embodiments, the reference voltage Vss is ground.

The n-drain region 30 is electrically connected to the I/O pad 50 and is the collector of the parasitic vertical NPN BJT 22. The n-buried layer (NBL) 28 is the emitter of the parasitic vertical NPN BJT 22, and the p-well region 26 is the base of the parasitic vertical NPN BJT 22.

In operation, the n-buried layer 28 is electrically connected to the reference voltage Vss, such as ground, and the p-well region 26 is floating. When an ESD event hits the I/O pad 50, the parasitic vertical NPN BJT 22 is biased on, such as due to avalanche breakdown through the collector to the base and the emitter. With the base floating, the ESD trigger voltage Vt1 for biasing on the parasitic vertical NPN BJT 22 is lower, such that the parasitic vertical NPN BJT 22 is biased on sooner. This provides an early ESD discharge path through the parasitic vertical NPN BJT 22 to the n-buried layer 28 and the reference voltage Vss.

Figure 3:
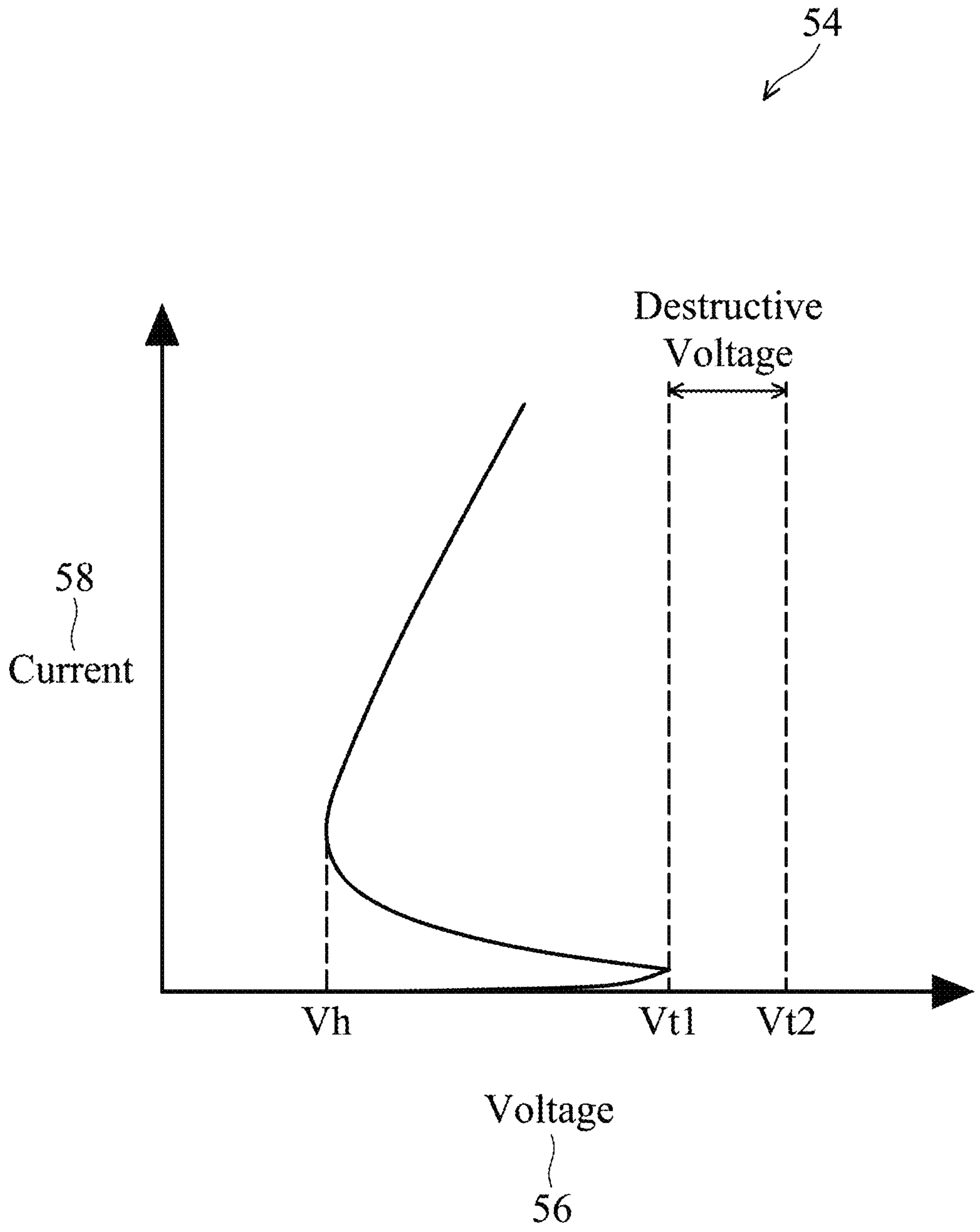
FIG. 3 is a diagram schematically illustrating an I-V curve for the parasitic vertical NPN BJT, in accordance with some embodiments.

FIG. 3 is a diagram schematically illustrating an I-V curve 54 for the parasitic vertical NPN BJT 22, in accordance with some embodiments. The I-V curve includes Voltage along the x-axis 56 and Current along the y-axis 58.

The parasitic vertical NPN BJT 22 is biased on when the voltage across the parasitic vertical NPN BJT 22 reaches the ESD trigger voltage Vt1. The biased on parasitic vertical NPN BJT 22 provides an ESD current path through the parasitic vertical NPN BJT 22 to the reference voltage Vss, and the voltage across the parasitic vertical NPN BJT 22, from the n-drain region 30 to the n-source region 32, decreases to a hold voltage Vh. With the ESD trigger voltage Vt1 less than a destructive voltage, such as a victim's destructive voltage Vt2, the parasitic vertical NPN BJT 22 prevents damage to the semiconductor device 20 from an ESD event.

Figure 4:
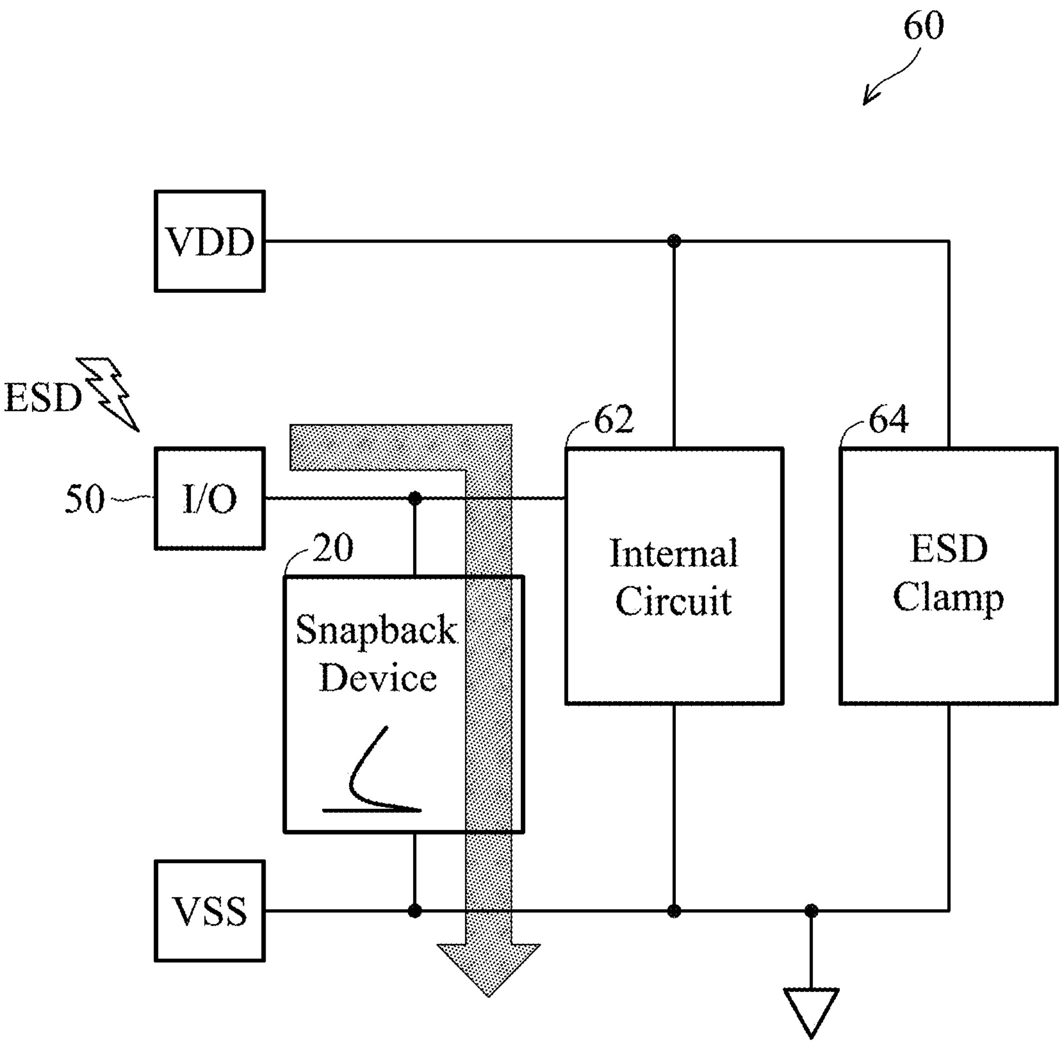
FIG. 4 is a diagram schematically illustrating a semiconductor device that includes the semiconductor device of FIG. 1, in accordance with some embodiments.

FIG. 4 is a diagram schematically illustrating a semiconductor device 60 that includes the semiconductor device 20 of FIG. 1, in accordance with some embodiments. The semiconductor device 60 includes the semiconductor device 20, an internal circuit 62, and an ESD clamp 64. The semiconductor device 20 is the snapback device of FIGS. 1 and 2. In some embodiments, the ESD clamp 64 is an ESD power supply clamp. In other embodiments, the snapback device can be a different semiconductor device.

The internal circuit 62 and the ESD clamp 64 are each electrically connected to a power voltage Vdd and to a reference voltage Vss. The internal circuit 62 and the semiconductor device 20 are each electrically connected to the I/O pad 50 and the semiconductor device 20 is electrically connected to the reference voltage Vss.

In operation, an ESD event strikes the I/O pad 50 and the semiconductor device 20 discharges ESD current through the semiconductor device 20 to the reference voltage Vss before the ESD event has a chance to degrade or damage the internal circuit 62. In some embodiments, this is referred to as PS mode.

Figure 5:
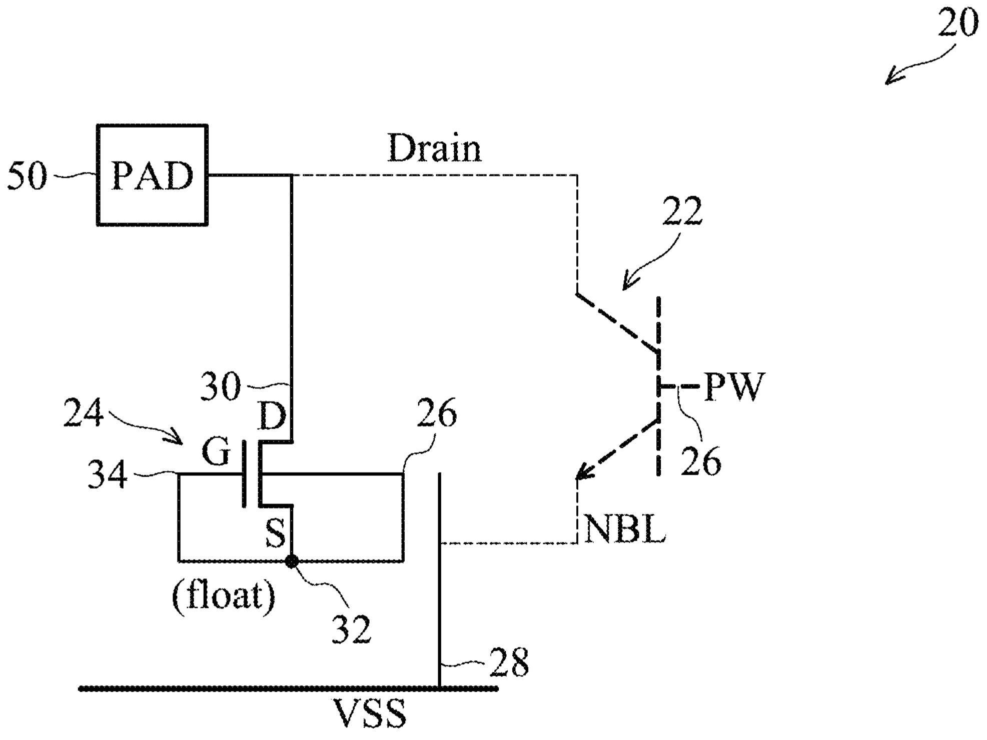
FIG. 5 is a diagram schematically illustrating the semiconductor device of FIG. 1 with the MOSFET and the parasitic vertical NPN BJT, in accordance with some embodiments.

FIG. 5 is a diagram schematically illustrating the semiconductor device 20 with the MOSFET 24 and the parasitic vertical NPN BJT 22, in accordance with some embodiments. The MOSFET 24 includes the n-drain region 30 electrically connected to the I/O pad 50, where the n-drain region 30 is the collector of the parasitic vertical NPN BJT 22. The MOSFET 24 further includes the gate 34 electrically connected to the n-source region 32 that is electrically connected to the p-well region 26, which are all floating. The n-buried layer 28 is the emitter of the parasitic vertical NPN BJT 22, where the n-buried layer 28 is electrically connected to the reference voltage Vss, and the p-well region 26 is the base of the parasitic vertical NPN BJT 22, where the p-well region 26 is floating.

In operation, when an ESD event strikes the I/O pad 50, the parasitic vertical NPN BJT 22 is biased on, such as due to avalanche breakdown through the collector to the base and the emitter. With the base floating, the ESD trigger voltage Vt1 for biasing on the parasitic vertical NPN BJT 22 is lower, such that the parasitic vertical NPN BJT 22 is biased on sooner. This provides an early ESD discharge path through the parasitic vertical NPN BJT 22 to the n-buried layer 28 and the reference voltage Vss.

Figure 6:
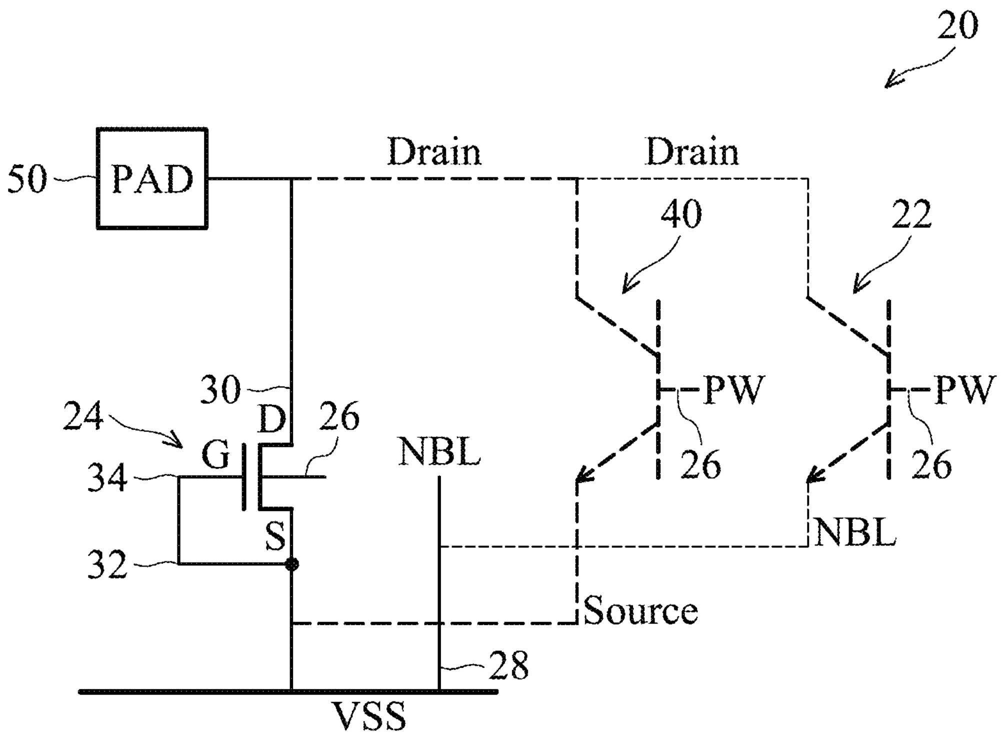
FIG. 6 is a diagram schematically illustrating the semiconductor device of FIG. 1 with the MOSFET, the parasitic vertical NPN BJT, and the parasitic lateral NPN BJT, in accordance with some embodiments.

FIG. 6 is a diagram schematically illustrating the semiconductor device 20 with the MOSFET 24, the parasitic vertical NPN BJT 22, and the parasitic lateral NPN BJT 40, in accordance with some embodiments.

The MOSFET 24 includes the n-drain region 30 electrically connected to the I/O pad 50, where the n-drain region 30 is the collector of the parasitic vertical NPN BJT 22 and the collector of the parasitic lateral NPN BJT 40. The MOSFET 24 further includes the gate 34 electrically connected to the n-source region 32 that is electrically connected to the reference voltage Vss. The n-source region 32 is the emitter of the parasitic lateral NPN BJT 40. The n-buried layer 28 is the emitter of the parasitic vertical NPN BJT 22, where the n-buried layer 28 is electrically connected to the reference voltage Vss. The p-well region 26 is the base of the parasitic vertical NPN BJT 22 and the base of the parasitic lateral NPN BJT 40. The p-well region 26 is floating.

In operation, when an ESD event strikes the I/O pad 50, the parasitic vertical NPN BJT 22 is biased on, such as due to avalanche breakdown through the collector to the base and the emitter, and the parasitic lateral NPN BJT 40 is biased on, such as due to avalanche breakdown through the collector to the base and the emitter. With the parasitic vertical NPN BJT 22 and the parasitic lateral NPN BJT 40 biased on, the ESD trigger voltage Vt1 is lowered even further such that the ESD current is discharged sooner. This provides an earlier ESD discharge path through the parasitic vertical NPN BJT 22 and the parasitic lateral NPN BJT 40 to the reference voltage Vss.

Figure 7:
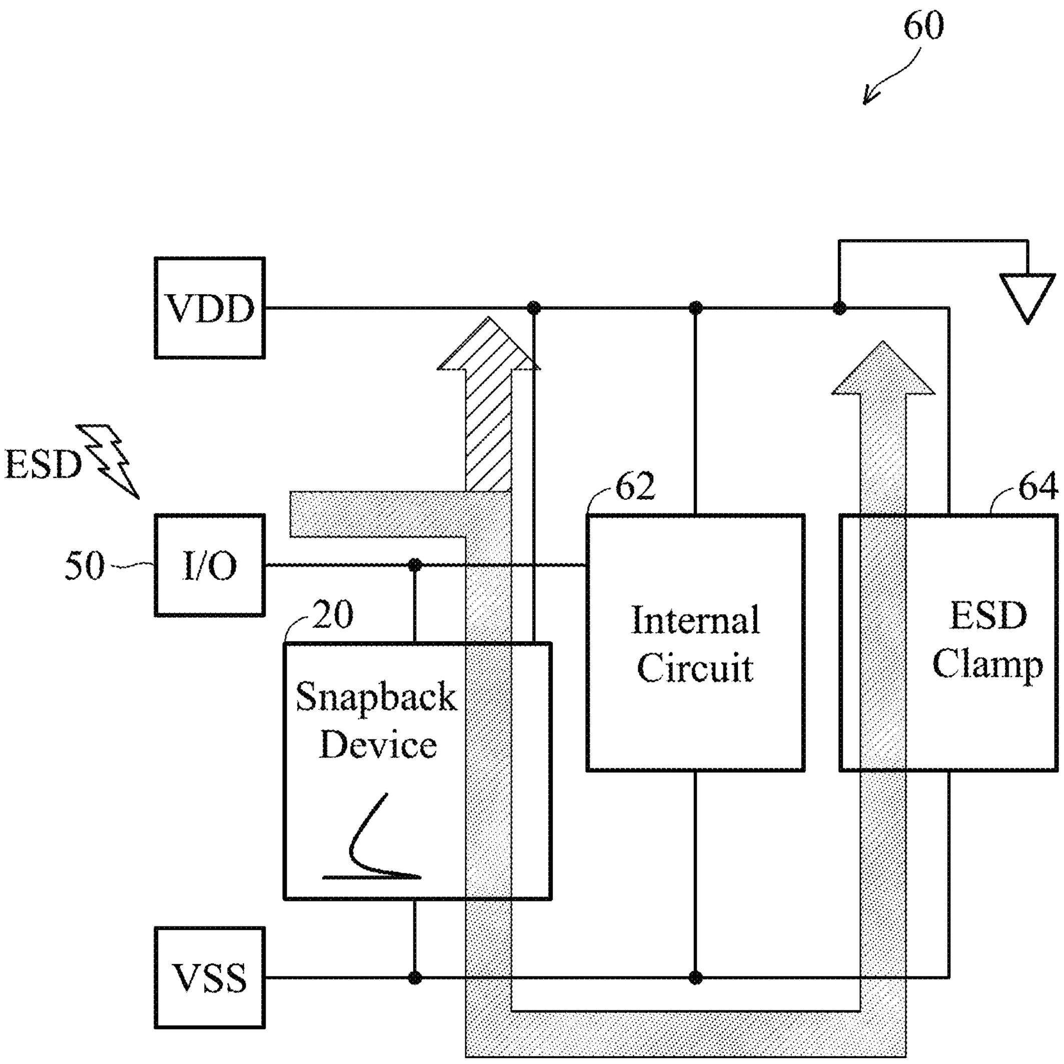
FIG. 7 is a diagram schematically illustrating the semiconductor device of FIG. 4 in another ESD scenario, in accordance with some embodiments.

FIG. 7 is a diagram schematically illustrating the semiconductor device 60 in another ESD scenario, in accordance with some embodiments. In this scenario, the ESD event strikes the I/O pad 50 and flows through a snapback device to the reference voltage Vss. Then, the ESD current flows through the ESD clamp 64 to the power voltage Vdd. The ESD current has a path through the metal bus of the reference voltage Vss and the body diode of the ESD clamp 64 to the power voltage Vdd. Thus, the ESD current flows from the I/O pad 50 to the power voltage Vdd. In some embodiments, this is referred to as PD mode.

To accommodate this scenario, the semiconductor device 20 is configured to discharge the ESD current to the reference voltage Vss and to the power voltage Vdd. The semiconductor device 60 includes the semiconductor device 20, the internal circuit 62, and the ESD clamp 64. The semiconductor device 20, the internal circuit 62, and the ESD clamp 64 are each electrically connected to the power voltage Vdd and to the reference voltage Vss. The internal circuit 62 and the semiconductor device 20 are each electrically connected to the I/O pad 50.

In operation, an ESD event strikes the I/O pad 50 and the semiconductor device 20 discharges ESD current through the semiconductor device 20 to the reference voltage Vss and to the power voltage Vdd before the ESD event has a chance to degrade or damage the internal circuit 62.

Figure 8:
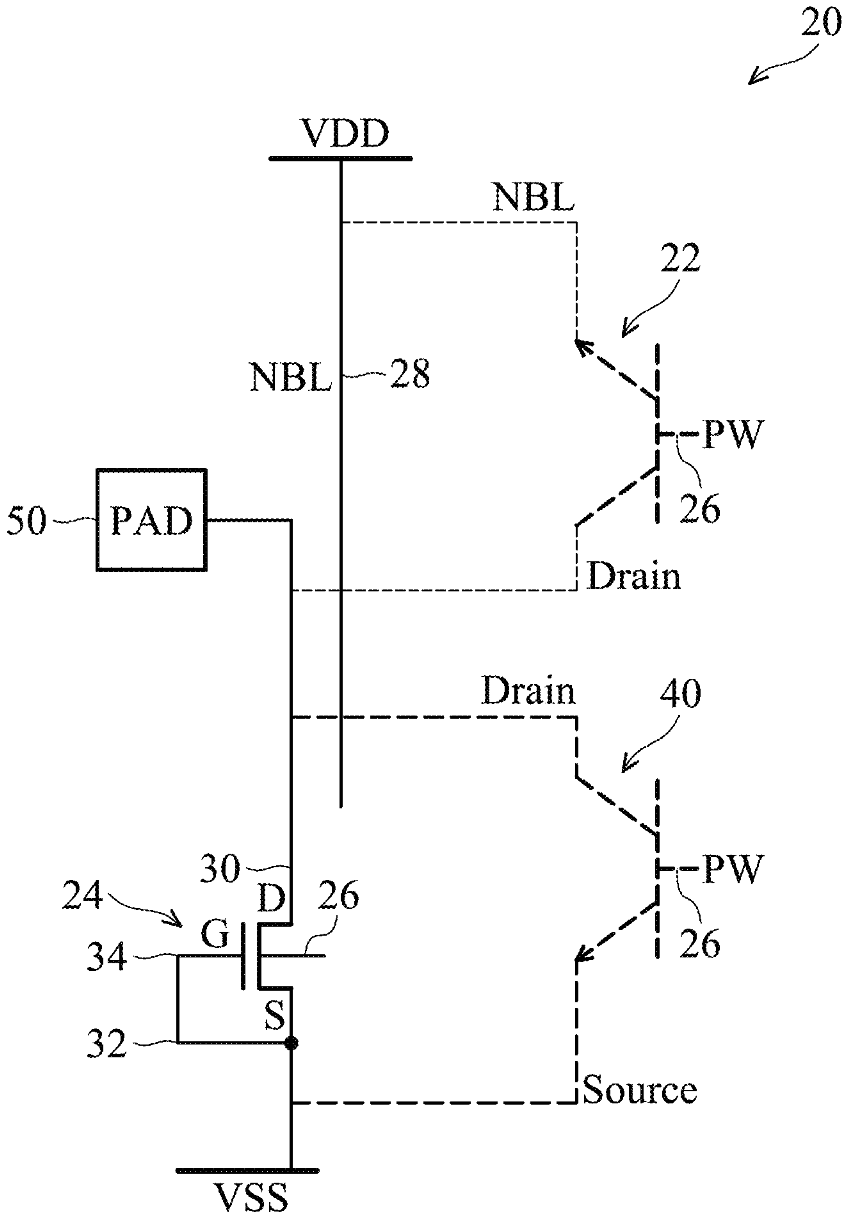
FIG. 8 is a diagram schematically illustrating the semiconductor device of FIG. 1 configured to discharge ESD current to the reference voltage Vss and to the power voltage Vdd, in accordance with some embodiments.

FIG. 8 is a diagram schematically illustrating the semiconductor device 20 (shown in FIG. 7) configured to discharge ESD current to the reference voltage Vss and to the power voltage Vdd, in accordance with some embodiments. The semiconductor device 20 includes the MOSFET 24, the parasitic vertical NPN BJT 22, and the parasitic lateral NPN BJT 40.

The MOSFET 24 includes the n-drain region 30 electrically connected to the I/O pad 50, where the n-drain region 30 is the collector of the parasitic vertical NPN BJT 22 and the collector of the parasitic lateral NPN BJT 40. The MOSFET 24 further includes the gate 34 electrically connected to the n-source region 32 that is electrically connected to the reference voltage Vss. The n-source region 32 is the emitter of the parasitic lateral NPN BJT 40. The n-buried layer 28 is the emitter of the parasitic vertical NPN BJT 22, where the n-buried layer 28 is electrically connected to the power voltage Vdd. The p-well region 26 is the base of the parasitic vertical NPN BJT 22 and the base of the parasitic lateral NPN BJT 40. The p-well region 26 is floating.

In operation, when an ESD event strikes the I/O pad 50, the parasitic vertical NPN BJT 22 is biased on, such as due to avalanche breakdown through the collector to the base and the emitter, and the parasitic lateral NPN BJT 40 is biased on, such as due to avalanche breakdown through the collector to the base and the emitter. The parasitic vertical NPN BJT 22 is biased on to discharge ESD current to the power voltage Vdd, and the parasitic lateral NPN BJT 40 is biased on to discharge ESD current to the reference voltage Vss. With the parasitic vertical NPN BJT 22 and the parasitic lateral NPN BJT 40 biased on, the ESD trigger voltage Vt1 is lowered such that the ESD current is discharged sooner. This provides an earlier ESD discharge path through the parasitic vertical NPN BJT 22 to the power voltage Vdd and through the parasitic lateral NPN BJT 40 to the reference voltage Vss.

Figure 9:
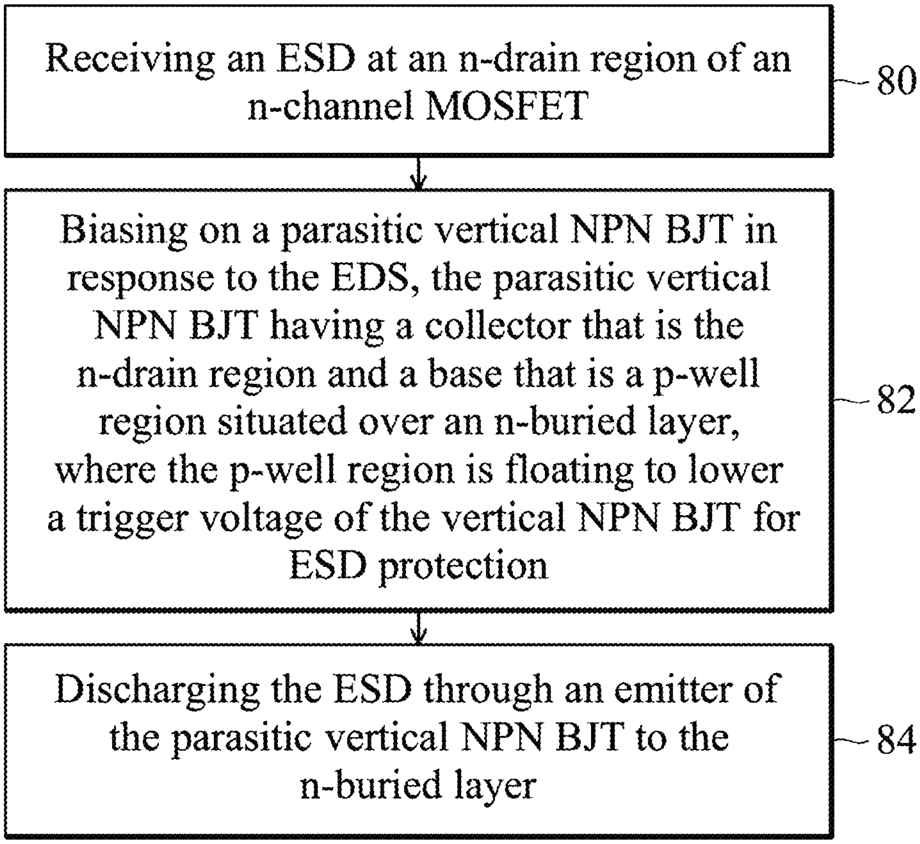
FIG. 9 is a diagram schematically illustrating a method of operating an ESD protection device, in accordance with some embodiments.

FIG. 9 is a diagram schematically illustrating a method of operating an ESD protection device, in accordance with some embodiments. In some embodiments the ESD protection device is like semiconductor device 20 of FIG. 1.

At step 80, the method includes receiving an ESD strike at an n-drain region of an n-channel MOSFET. In some embodiments, the n-drain region is like the n-drain region 30 (shown in FIG. 1). In some embodiments, the n-channel MOSFET is like the n-channel MOSFET 24 (shown in FIG. 1).

At step 82, the method includes biasing on a parasitic vertical NPN BJT in response to the ESD strike. The parasitic vertical NPN BJT has a collector that is the n-drain region and a base that is a p-well region situated over an n-buried layer in the semiconductor device. The p-well region is floating to lower the ESD trigger voltage Vt1 of the vertical NPN BJT for ESD protection. In some embodiments, the p-well region is like the p-well region 26 (shown in FIG. 1). In some embodiments, the n-buried layer is like the n-buried layer 28 (shown in FIG. 1). In some embodiments, the parasitic vertical NPN BJT is like the parasitic vertical NPN BJT 22 (shown in FIG. 1).

At step 84, the method includes discharging the ESD through an emitter of the parasitic vertical NPN BJT to the n-buried layer. In some embodiments, discharging the ESD through the emitter of the parasitic vertical NPN BJT includes discharging the ESD to the n-buried layer that is at a reference voltage Vss. In some embodiments, discharging the ESD through the emitter of the parasitic vertical NPN BJT includes discharging the ESD to the n-buried layer that is at a power voltage Vdd. In some embodiments, the method includes discharging the ESD through a parasitic lateral NPN BJT that has a collector that is the n-drain region, an emitter that is a source region of the n-channel MOSFET, and a base that is the p-well region.

Figure 10:
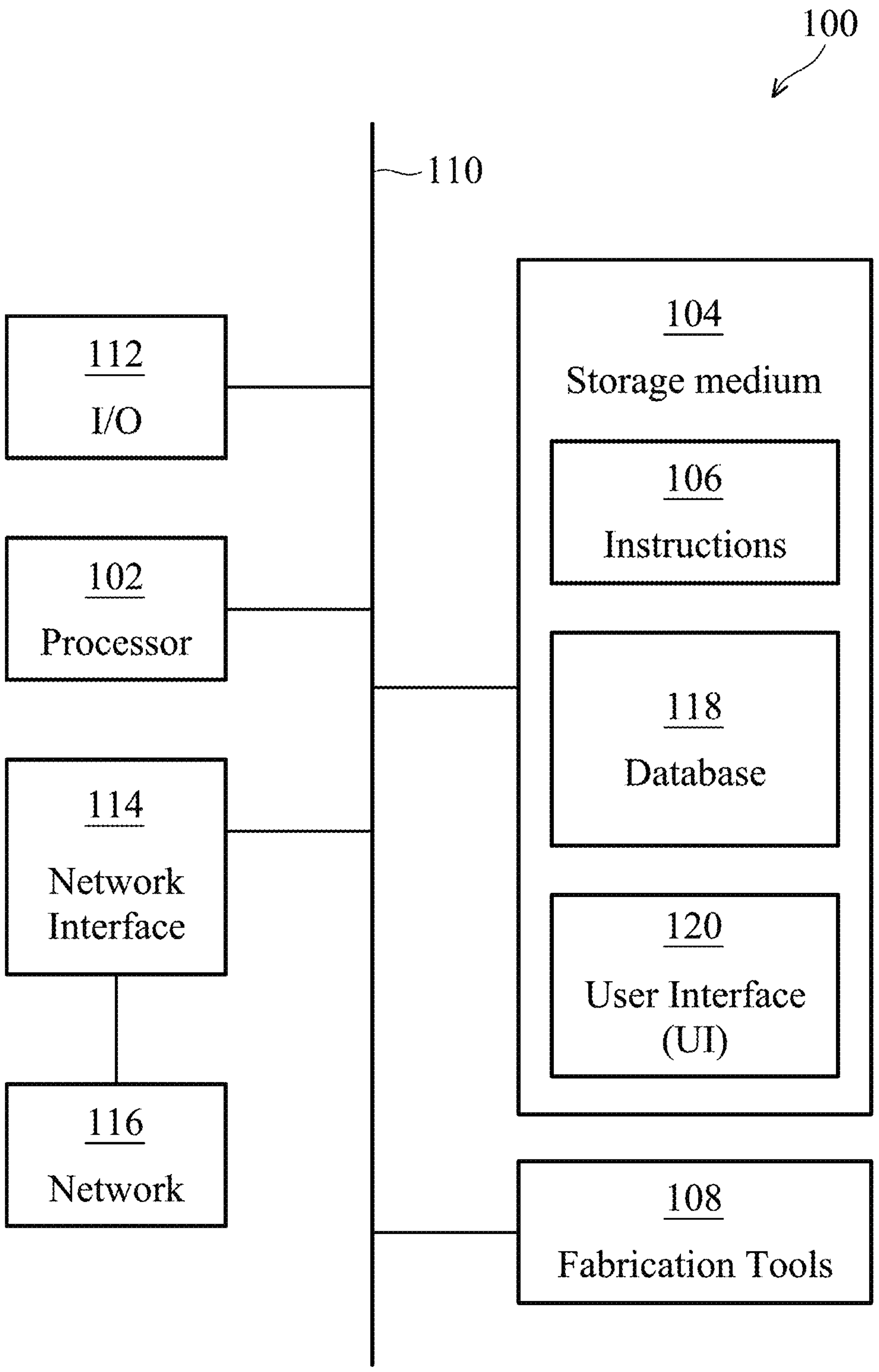
FIG. 10 is a block diagram schematically illustrating an example of a computer system configured to provide the semiconductor devices and methods of the current disclosure, in accordance with some embodiments.

FIG. 10 is a block diagram schematically illustrating an example of a computer system 100 configured to provide the semiconductor devices and methods of the current disclosure, in accordance with some embodiments. Some or all the design, layout, and manufacture of the semiconductor devices, also referred to as semiconductor circuits, can be performed by or with the computer system 100. In some embodiments, the computer system 100 includes an electronic design automation (EDA) system. In some embodiments, the semiconductor devices are ICs.

In some embodiments, the system 100 is a general-purpose computing device including a processor 102 and a non-transitory, computer-readable storage medium 104. The computer-readable storage medium 104 may be encoded with, e.g., store, computer program code such as executable instructions 106. Execution of the instructions 106 by the processor 102 provides (at least in part) a design tool that implements a portion or all the functions of the system 100, such as pre-layout simulations, post-layout simulations, routing, rerouting, and final layout for manufacturing. Further, fabrication tools 108 are included to further layout and physically implement the design and manufacture of the semiconductor devices. In some embodiments, execution of the instructions 106 by the processor 102 provides (at least in part) a design tool that implements a portion or all the functions of the system 100. In some embodiments, the system 100 includes a commercial router. In some embodiments, the system 100 includes an automatic place and route (APR) system.

The processor 102 is electrically coupled to the computer-readable storage medium 104 by a bus 110 and to an I/O interface 112 by the bus 110. A network interface 114 is also electrically connected to the processor 102 by the bus 110. The network interface 114 is connected to a network 116, so that the processor 102 and the computer-readable storage medium 104 can connect to external elements using the network 116. The processor 102 is configured to execute the computer program code or instructions 106 encoded in the computer-readable storage medium 104 to cause the system 100 to perform a portion or all the functions of the system 100, such as providing the semiconductor devices and methods of the current disclosure and other functions of the system 100. In some embodiments, the processor 102 is a central processing unit (CPU), a multi-processor, a distributed processing system, an application specific integrated circuit (ASIC), and/or a suitable processing unit.

In some embodiments, the computer-readable storage medium 104 is an electronic, magnetic, optical, electromagnetic, infrared, and/or semiconductor system or apparatus or device. For example, the computer-readable storage medium 104 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 104 can include a compact disk read only memory (CD-ROM), a compact disk read/write memory (CD-R/W), and/or a digital video disc (DVD).

In some embodiments, the computer-readable storage medium 104 stores computer program code or instructions 106 configured to cause the system 100 to perform a portion or all the functions of the system 100. In some embodiments, the computer-readable storage medium 104 also stores information which facilitates performing a portion or all the functions of the system 100. In some embodiments, the computer-readable storage medium 104 stores a database 118 that includes one or more of component libraries, digital circuit cell libraries, and databases.

The system 100 includes the I/O interface 112, which is coupled to external circuitry. In some embodiments, the I/O interface 112 includes a keyboard, keypad, mouse, trackball, trackpad, touchscreen, and/or cursor direction keys for communicating information and commands to the processor 102.

The network interface 114 is coupled to the processor 102 and allows the system 100 to communicate with the network 116, to which one or more other computer systems are connected. The network interface 114 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 100 can be performed in two or more systems that are like system 100.

The system 100 is configured to receive information through the I/O interface 112. The information received through the I/O interface 112 includes one or more of instructions, data, design rules, libraries of components and cells, and/or other parameters for processing by the processor 102. The information is transferred to the processor 102 by the bus 110. Also, the system 100 is configured to receive information related to a user interface (UI) through the I/O interface 112. This UI information can be stored in the computer-readable storage medium 104 as a UI 120.

In some embodiments, a portion or all the functions of the system 100 are implemented via a standalone software application for execution by a processor. In some embodiments, a portion or all the functions of the system 100 are implemented in a software application that is a part of an additional software application. In some embodiments, a portion or all the functions of the system 100 are implemented as a plug-in to a software application. In some embodiments, at least one of the functions of the system 100 is implemented as a software application that is a portion of an EDA tool. In some embodiments, a portion or all the functions of the system 100 are implemented as a software application that is used by the system 100. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 100 include fabrication tools 108 for implementing the manufacturing processes of the system 100. For example, based on the final layout, photolithographic masks may be generated, which are used to fabricate the semiconductor device by the fabrication tools 108.

Figure 11:
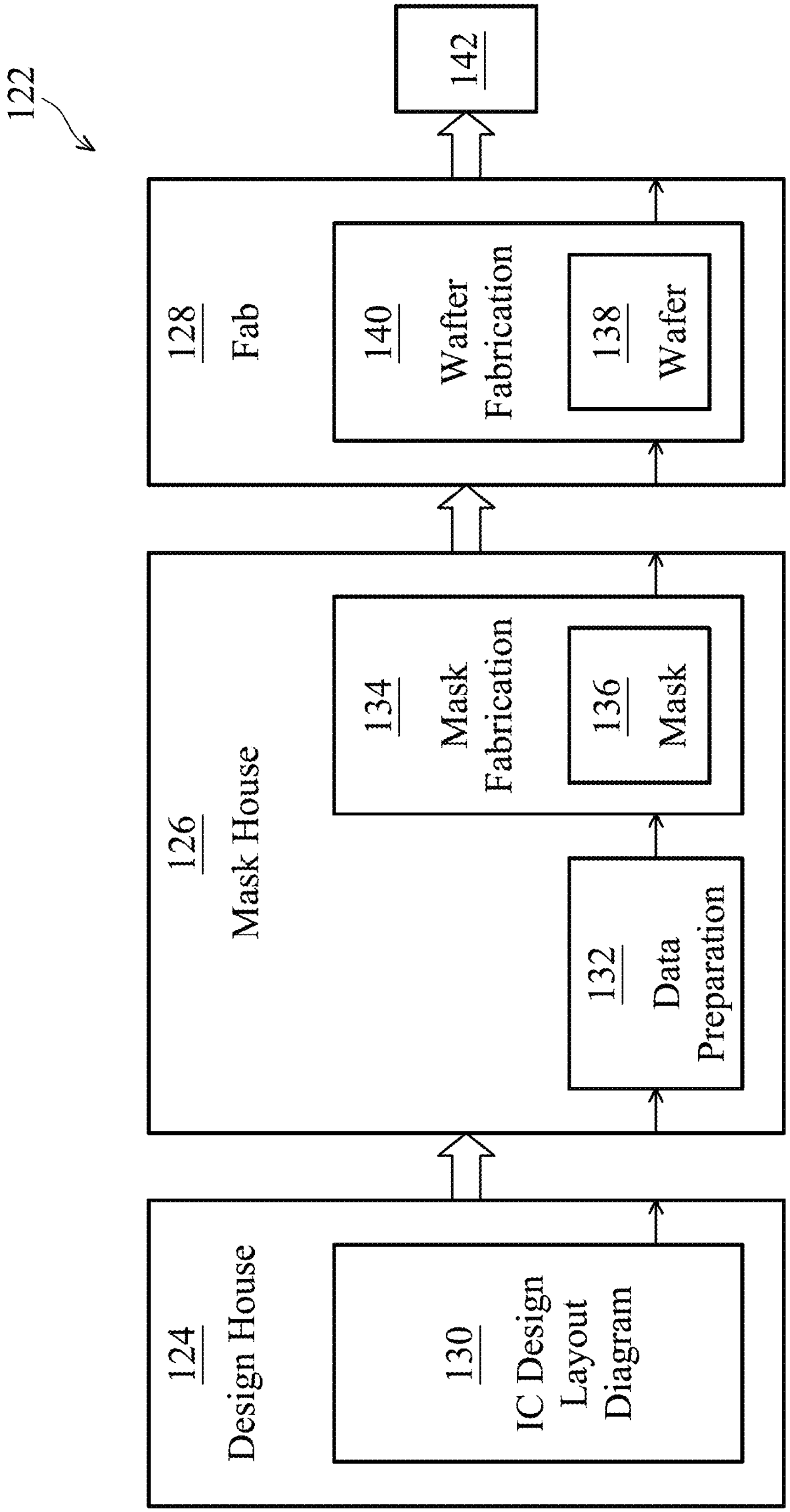
FIG. 11 is a block diagram of a semiconductor device manufacturing system and a semiconductor device manufacturing flow associated therewith, in accordance with some embodiments.

Further aspects of device fabrication are disclosed in conjunction with FIG. 11, which is a block diagram of a semiconductor device manufacturing system 122 and a semiconductor device manufacturing flow associated therewith, in accordance with some embodiments. In some embodiments, based on a layout diagram, one or more semiconductor masks and/or at least one component in a layer of a semiconductor device is fabricated using the manufacturing system 122.

In FIG. 11, the semiconductor device manufacturing system 122 includes entities, such as a design house 124, a mask house 126, and a semiconductor device manufacturer/fabricator ("Fab") 128, that interact with one another in the design, development, and manufacturing cycles and/or services related to manufacturing a semiconductor device, such as the semiconductor devices described herein. The entities in the system 122 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 124, the mask house 126, and the semiconductor device fab 128 are owned by a single larger company. In some embodiments, two or more of the design house 124, the mask house 126, and the semiconductor device fab 128 coexist in a common facility and use common resources.

The design house (or design team) 124 generates a semiconductor device design layout diagram 130. The semiconductor device design layout diagram 130 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 130 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 124 implements a design procedure to form a semiconductor device design layout diagram 130. The semiconductor device design layout diagram 130 is presented in one or more data files having information of the geometrical patterns. For example, semiconductor device design layout diagram 130 can be expressed in a GDSII file format or DFII file format. In some embodiments, the design procedure includes one or more of analog circuit design, digital circuit design, logic circuit design, standard cell circuit design, power distribution network (PDN) design including power via design, supply voltage track design, reference voltage track design, place and route routines, and physical layout designs.

The mask house 126 includes data preparation 132 and mask fabrication 134. The mask house 126 uses the semiconductor device design layout diagram 130 to manufacture one or more masks 136 to be used for fabricating the various layers of the semiconductor device or semiconductor structure. The mask house 126 performs mask data preparation 132, where the semiconductor device design layout diagram 130 is translated into a representative data file (RDF). The mask data preparation 132 provides the RDF to the mask fabrication 134. The mask fabrication 134 includes a mask writer that converts the RDF to an image on a substrate, such as a mask (reticle) 136 or a semiconductor wafer 138. The design layout diagram 130 is manipulated by the mask data preparation 132 to comply with characteristics of the mask writer and/or criteria of the semiconductor device fab 128. In FIG. 11, the mask data preparation 132 and the mask fabrication 134 are illustrated as separate elements. In some embodiments, the mask data preparation 132 and the mask fabrication 134 can be collectively referred to as mask data preparation.

In some embodiments, the mask data preparation 132 includes an optical proximity correction (OPC) which uses lithography enhancement techniques to compensate for image errors, such as those that can arise from diffraction, interference, other process effects and the like. The OPC adjusts the semiconductor device design layout diagram 130. In some embodiments, the mask data preparation 132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 132 includes a mask rule checker (MRC) that checks the semiconductor device design layout diagram 130 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 130 to compensate for limitations during the mask fabrication 134, which may undo part of the modifications performed by OPC to meet mask creation rules.

In some embodiments, the mask data preparation 132 includes lithography process checking (LPC) that simulates processing that will be implemented by the semiconductor device fab 128. LPC simulates this processing based on the semiconductor device design layout diagram 130 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are to be repeated to further refine the semiconductor device design layout diagram 130.

The above description of mask data preparation 132 has been simplified for the purposes of clarity. In some embodiments, data preparation 132 includes additional features such as a logic operation (LOP) to modify the semiconductor device design layout diagram 130 according to manufacturing rules. Additionally, the processes applied to the semiconductor device design layout diagram 130 during data preparation 132 may be executed in a variety of different orders.

After the mask data preparation 132 and during the mask fabrication 134, a mask 136 or a group of masks 136 are fabricated based on the modified semiconductor device design layout diagram 130. In some embodiments, the mask fabrication 134 includes performing one or more lithographic exposures based on the semiconductor device design layout diagram 130. In some embodiments, an electron-beam (e-beam) or a mechanism of multiple e-beams is used to form a pattern on a mask (photomask or reticle) 136 based on the modified semiconductor device design layout diagram 130. The mask 136 can be formed in various technologies. In some embodiments, the mask 136 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 136 includes a transparent substrate (e.g., fused quartz) and an opaque material (e.g., chromium) coated in the opaque regions of the binary mask. In another example, the mask 136 is formed using a phase shift technology. In a phase shift mask (PSM) version of the mask 136, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 134 is used in a variety of processes. For example, such a mask(s) is used in an ion implantation process to form various doped regions in the semiconductor wafer 138, in an etching process to form various etching regions in the semiconductor wafer 138, and/or in other suitable processes.

The semiconductor device fab 128 includes wafer fabrication 140. The semiconductor device fab 128 is a semiconductor device fabrication business that includes one or more manufacturing facilities for the fabrication of a variety of different semiconductor device products. In some embodiments, the semiconductor device fab 128 is a semiconductor foundry. For example, there may be a manufacturing facility for the front end of line (FEOL) fabrication of a plurality of semiconductor device products, while a second manufacturing facility may provide the back end of line (BEOL) fabrication for the interconnection and packaging of the semiconductor device products, and a third manufacturing facility may provide other services for the foundry business.

The semiconductor device fab 128 uses the mask(s) 136 fabricated by the mask house 126 to fabricate the semiconductor structures or semiconductor devices 142 of the current disclosure. Thus, the semiconductor device fab 128 at least indirectly uses the semiconductor device design layout diagram 130 to fabricate the semiconductor structures or semiconductor devices 142 of the current disclosure. Also, the semiconductor wafer 138 includes a silicon substrate or other proper substrate having material layers formed thereon, and the semiconductor wafer 138 further includes one or more of various doped regions, dielectric features, multilevel interconnects, and the like (formed at subsequent manufacturing steps). In some embodiments, the semiconductor wafer 138 is fabricated by the semiconductor device fab 128 using the mask(s) 136 to form the semiconductor structures or semiconductor devices 142 of the current disclosure. In some embodiments, the semiconductor device fabrication includes performing one or more lithographic exposures based at least indirectly on the semiconductor device design layout diagram 130.

Disclosed embodiments of the present application provide a semiconductor device that includes a parasitic vertical NPN BJT for discharging ESD current. The parasitic vertical NPN BJT is configured to discharge the ESD current to either the reference voltage Vss or the power voltage Vdd. In some embodiments, the semiconductor device includes a parasitic lateral NPN BJT for discharging ESD current. In some embodiments, both the parasitic vertical NPN BJT and the parasitic lateral NPN BJT discharge ESD current at the same time. In some embodiments, the semiconductor device is an RPO MOS device.

The semiconductor device includes an n-buried layer, a p-well region over the n-buried layer, and a snapback device for ESD protection. The snapback device includes an n-channel MOSFET that includes an n-drain region and an n-source region. The parasitic vertical NPN BJT includes a collector at the n-drain region, an emitter at the n-buried layer, and a base at the p-well region, where the p-well region is floating and not connected to a reference voltage or a power voltage. With the floating p-well, the parasitic vertical NPN BJT has a lower ESD triggering voltage Vt1. In some embodiments, the semiconductor device includes a parasitic lateral NPN BJT that includes a collector at the n-drain region, an emitter at the n-source region, and a base at the p-well region, where the p-well region is floating and not connected to a reference voltage or a power voltage.

In accordance with some embodiments, a semiconductor device includes an n-buried layer, a p-well region over the n-buried layer, an n-channel MOSFET that includes an n-drain region, and a vertical NPN BJT having a collector that is the n-drain region and a base that is the p-well region. The p-well region is floating.

In accordance with further embodiments, a semiconductor device includes an n-buried layer that is electrically connected to a reference voltage Vss or a power voltage Vdd, a p-well region over the n-buried layer, an n-channel MOSFET that includes an n-drain region electrically connected to an I/O pad, and a vertical NPN BJT having a collector that is the n-drain region, an emitter that is the n-buried layer, and a base that is the p-well region. The p-well region is floating.

In accordance with still further disclosed aspects, a method of operating an ESD protection device includes: receiving an ESD at an n-drain region of an n-channel MOSFET; biasing on a vertical NPN BJT in response to the ESD, the vertical NPN BJT having a collector that is the n-drain region and a base that is a p-well region situated over an n-buried layer, where the p-well region is floating; and discharging the ESD through an emitter of the vertical NPN BJT to the n-buried layer.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
- an n-buried layer;
- a p-well region over the n-buried layer;
- an n-channel metal-oxide semiconductor field-effect transistor that includes an n-drain region; and
- a vertical NPN bipolar junction transistor having a collector that is the n-drain region and a base that is the p-well region, wherein the p-well region is floating, and the n-channel metal-oxide semiconductor field-effect transistor includes a source that is floating.

2. The device of claim 1, wherein the vertical NPN bipolar junction transistor has an emitter that is the n-buried layer.

3. The device of claim 2, wherein the n-buried layer is electrically connected to a reference voltage Vss.

4. The device of claim 1, wherein the n-drain region is electrically connected to an input/output pad.

5. The device of claim 1, wherein the n-drain region includes an n+ region.

6. The device of claim 1, wherein the vertical NPN bipolar junction transistor has an emitter that is the n-buried layer that is electrically connected to a power voltage Vdd.

7. A semiconductor device, comprising:
- an n-buried layer that is electrically connected to a reference voltage Vss or a power voltage Vdd;

a p-well region over the n-buried layer;

an n-channel metal-oxide semiconductor field-effect transistor that includes an n-drain region electrically connected to an input/output pad; and a vertical NPN bipolar junction transistor having a collector that is the n-drain region, an emitter that is the n-buried layer, and a base that is the p-well region, wherein the p-well region is floating, and the n-channel metal-oxide semiconductor field-effect transistor includes a source that is floating.

8. The device of claim 7, wherein the n-buried layer is electrically connected to the reference voltage Vss.

9. The device of claim 7, wherein the n-buried layer is electrically connected to the power voltage Vdd.

10. The device of claim 1, wherein the n-buried layer is electrically connected to a reference voltage Vss.

11. The device of claim 1, wherein the n-channel metal-oxide semiconductor field-effect transistor includes a gate that is floating.

12. The device of claim 1, wherein the source includes an n+ region.

13. The device of claim 7, wherein the n-drain region includes an n+ region.

14. The device of claim 7, wherein the n-channel metal-oxide semiconductor field-effect transistor includes a gate that is floating.

15. The device of claim 7, wherein the source includes an n+ region.

16. A semiconductor device, comprising:

an n-buried layer;

a p-well region over the n-buried layer;

an n-channel metal-oxide semiconductor field-effect transistor that includes an n-drain region, and a source region that is electrically connected to a reference voltage Vss;

a vertical NPN bipolar junction transistor having a collector that is the n-drain region, a base that is the p-well region that is floating, and an emitter that is the n-buried layer that is electrically connected to the reference voltage Vss; and a lateral NPN bipolar junction transistor having a collector that is the n-drain region, an emitter that is the source region, and a base that is the p-well region.

17. The device of claim 16, wherein the n-drain region is electrically connected to an input/output pad.

18. The device of claim 16, wherein the n-drain region includes an n+ region.

19. The device of claim 16, wherein the n-channel metal-oxide semiconductor field-effect transistor includes a gate that is floating.

20. The device of claim 16, wherein the source includes an n+ region.

* * * * *